United States Patent [19]
Herczeg et al.

[11] Patent Number: 5,335,239
[45] Date of Patent: Aug. 2, 1994

[54] THERMAL COMPENSATION FOR LASER DIODES USING ACTIVE FEEDBACK

[75] Inventors: Karen L. Herczeg; David M. Mcvay; Daniel J. Phelps, all of Rochester; Kimberley C. Bell, Webster, all of N.Y.

[73] Assignee: Eastman Kodak Company, Rochester, N.Y.

[21] Appl. No.: 32,233

[22] Filed: Mar. 17, 1993

[51] Int. Cl.$^5$ .............................................. H01S 3/00
[52] U.S. Cl. .......................................... 372/38; 372/34
[58] Field of Search ................. 372/26, 31, 34, 38

[56] References Cited

U.S. PATENT DOCUMENTS

| | | | |
|---|---|---|---|
| 4,056,719 | 11/1977 | Waaben | 250/199 |
| 4,075,474 | 2/1978 | Straus et al. | 250/199 |
| 4,211,929 | 7/1980 | Tamburelli | 250/55 |
| 4,317,520 | 3/1982 | Lombardo et al. | 209/3.1 |
| 4,625,105 | 11/1986 | Hentschel et al. | 250/205 |
| 4,647,950 | 3/1987 | Nosaki et al. | 346/160 |
| 4,701,609 | 10/1987 | Koishi et al. | 250/205 |
| 4,710,631 | 12/1987 | Aotsuka et al. | 372/34 |
| 4,821,273 | 4/1989 | Hori | 372/34 |
| 4,995,045 | 2/1991 | Burley et al. | 372/38 |
| 5,029,155 | 7/1991 | Kenjo | 369/116 |
| 5,149,962 | 9/1992 | Maurice | 250/227 |
| 5,197,076 | 3/1993 | Davis et al. | 372/34 |

Primary Examiner—Rodney B. Bovernick
Assistant Examiner—Robert E. Wise
Attorney, Agent, or Firm—Dennis R. Arndt

[57] ABSTRACT

Providing thermal compensation for laser diodes used in intensity modulated applications by using active feedback. A PIN diode serves as a laser light output sensor for the closed loop feedback system. The input from the PIN diode is convened into a voltage and then fed into a feedback amplifier. The PIN diode current is slightly dependent upon the temperature due to transmission effects of materials within the laser diode assembly. A temperature voltage signal generated by a semiconductor temperature sensor may be used as a second input to the feedback amplifier. The output of this amplifier is sampled at periodic intervals such as once a scan line, by a sample and hold amplifier. The output of the sample and hold amplifier is added to a data dependent modulated current reference in a summing amplifier. The output of the summing amplifier is the resultant sensor and provides an input reference to the laser driver integrated circuit.

15 Claims, 4 Drawing Sheets

THERMAL COMPENSATION FOR LASER DIODES USING ACTIVE FEEDBACK

TECHNICAL FIELD OF THE INVENTION

The invention relates to laser printing, and more particularly, to the thermal compensation of the laser exposure source in color gray scale printing of half-toned images and high quality text documents on an electrostatic print engine.

BACKGROUND OF THE INVENTION

The primary requirement of the laser modulator in a gray scale printer is to provide an adequate palette of the obtainable exposure space to control a predetermined number of exposure steps using the electrophotographic process. The steps are determined by the color space selected and the halftone patterns chosen for imaging.

Basic methods of laser modulation are well known. These methods are pulse width modulation, pulse number modulation and amplitude or intensity modulation. For pulse width modulation, the current supplied to the diode is constant. The modulation is done by changing the "on" time of the laser. For binary monochrome laser printers, a single "on" time or pulse width is used for each pixel. Gray scale printing requires different pulse widths for different gray levels. Pulse number modulation is similar to pulse width modulation in that the current supplied to the laser diode is constant. In gray scale printing, the desired exposure level is reached by the number of times the laser is cycled on and off during the pixel time. In order to cycle the laser, there must be a clock signal whose frequency is many times the frequency of the pixel clock. The high frequency clock signals are gated to the diode using counters for pulse number control. For amplitude or intensity modulation, the "on" time of the laser is constant. The "on" time is the pixel time. The modulation is accomplished by changing the current supplied to the diode. The intensity of the laser diode changes linearly with the current supplied to the diode.

The forward current and power characteristics of a given laser diode is usually provided by the manufacturer in the form of a graph like that shown in FIG. 3 which illustrates the characteristic of a 5 mW laser diode commonly used for laser printing. The laser threshold current is the level of current at which the diode begins to lase. The threshold current is determined graphically in FIG. 3 by drawing an asymptote to the upper linear portion of the characteristics. The intersection of the asymptote and the current axis gives the laser threshold current. As can be seen from the graph in FIG. 3, the current is sensitive to the temperature of the diode. The threshold current of the laser diode increases with temperature as illustrated in FIG. 4.

The increase in threshold current causes a severe drop in light output power. The reduced light output power may not expose the photoconductor to the required amount of energy for the desired output density. For the monochrome, binary printer, the thermal dependency on the laser diode can be minimized by setting the "on" state current to a much higher level than needed at nominal temperature. The current is high enough so that even with the thermally induced power reduction, the light output power is sufficient to expose the photoconductor down to the required level. For a gray scale laser printer which uses intensity or current modulation, overpowering the photoconductor at nominal conditions is not an option. The reason for this is that in intensity modulated systems, the current is the parameter which is changed to obtain the gray scale. It is common to use thermoelectric coolers with intensity modulated laser diodes. A thermoelectric cooler attempts to maintain the laser diode at a constant temperature regardless of ambient conditions. Thermoelectric coolers are custom designed for each application and are, therefore, expensive.

U.S. Pat. No. 4,995,045 is directed to the use of the back facet PIN diode of the laser for feedback in the control of a laser diode source in optical data communications. The patent describes a dual feedback technique used to maintain an average output power of the diode source regardless of the environmental and manufacturing variations of the diode. This, however, does not provide for the direct thermal input into the control of the laser; use of a temperature sensor can provide such an input.

U.S. Pat. No. 4,625,105 describes a technique which diverts a small fraction of the laser light into an external PIN type sensor for feedback purposes in the conversion of an electrical signal into an optical signal. Such an arrangement does not allow for the correction of back facet efficiency drift errors resulting from temperature changes.

The present invention provides thermal compensation for laser diodes used in intensity modulated applications by using feedback from the back facet PIN diode of the laser diode.

SUMMARY OF THE INVENTION

The invention provides a method and apparatus for obtaining a stable output of a laser diode over varying temperatures. The thermal compensation used herein is based upon the premise that the threshold current of the laser diode increases approximately linearly with temperature over the operating range of the printer. The control system uses two inputs. The first is the back facet PIN diode of the laser diode which produces a current directly proportional to the light incident upon the PIN diode. The PIN diode serves as the laser light output sensor for a closed loop feedback system.

The second input to the control system is a voltage signal which is directly proportional to the ambient temperature of the circuit. The temperature voltage signal is generated by a commercially available semiconductor temperature sensor; the response of this sensor is shown graphically in FIG. 5.

The temperature and light power inputs are summed, amplified and sampled at a known laser power level to produce a threshold current reference for the laser diode which differs from the threshold current by a constant factor. The threshold current reference is combined with the modulated current reference. The modulated current reference is a current representative of the intensity modulated current which produces the gray scale power level at the laser diode. These currents differ by a constant factor. The combination of reference currents is then applied to the laser driver integrated circuit to produce the drive current for the laser diode.

According to the present invention, an optical recording and/or reproducing apparatus has a laser diode for radiating a laser beam capable of being modulated by digital video data and writing on a photostatic receiver material. The apparatus comprises means for indicating the power level of the laser diode while operating at a known level to produce a threshold current in the form of a first signal and means for generating a second signal corresponding to the ambient temperature of the laser diode. A third threshold current reference signal is generated that is proportional to the first and second signals. The third signal is sampled at periodic intervals. The current level of the laser diode is measured when modulated by the digital video data to produce a modulated current reference signal. The threshold current reference signal is combined with the modulated current reference signal to produce a drive signal. Means are provided for driving the laser in response to the drive signal and then modulate the laser in response to the digital video data.

DETAILED DESCRIPTION OF THE PREFERRED EMBODIMENTS

Figure 1:
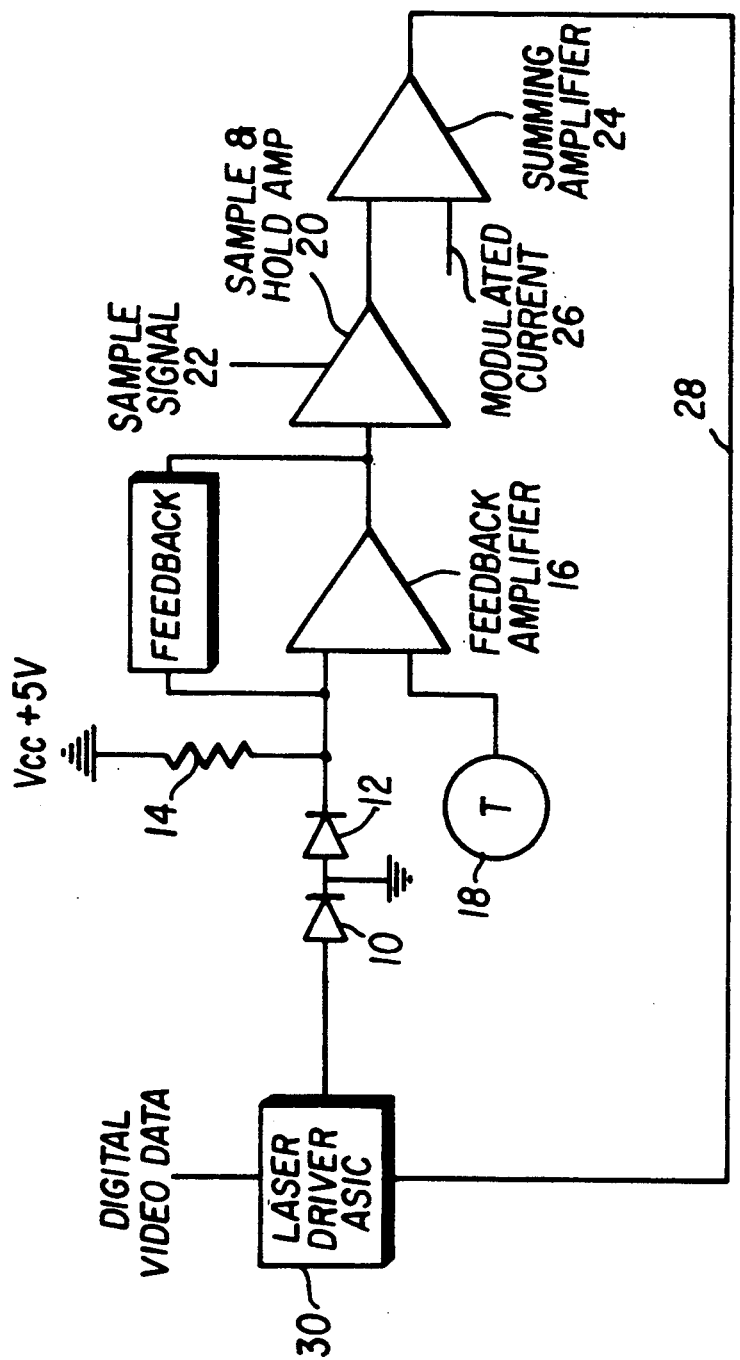
FIG. 1 is a block diagram of the active feedback thermal compensation circuit used to control a laser according to the present invention.
Figure 3:
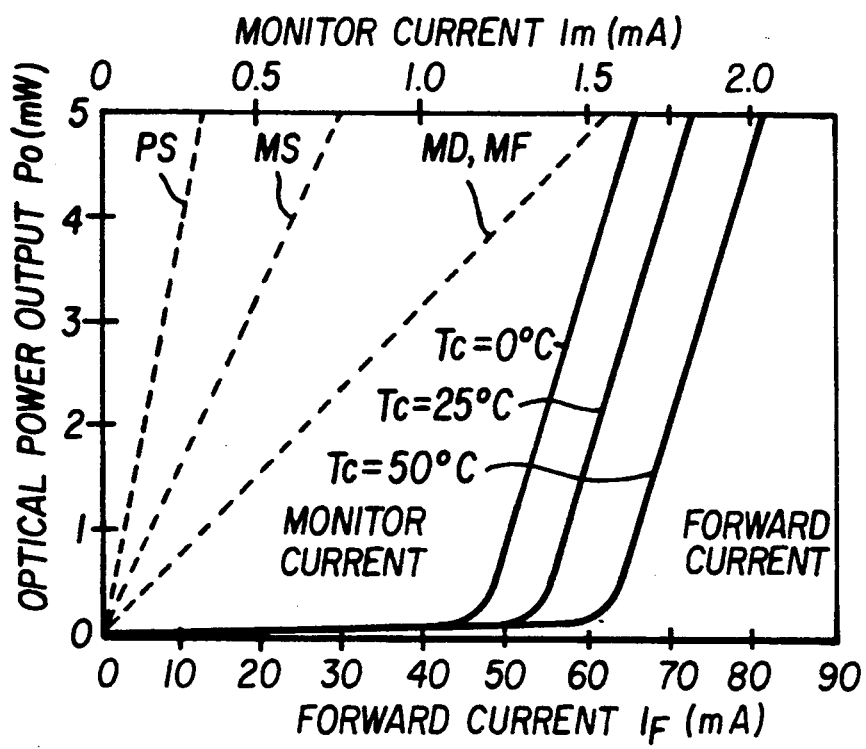
FIG. 3 graphically illustrates the forward and back facet characteristics of a 5 mw laser diode showing optical power output in mw vs. forward current $I_f$ in mA.
Figure 4:
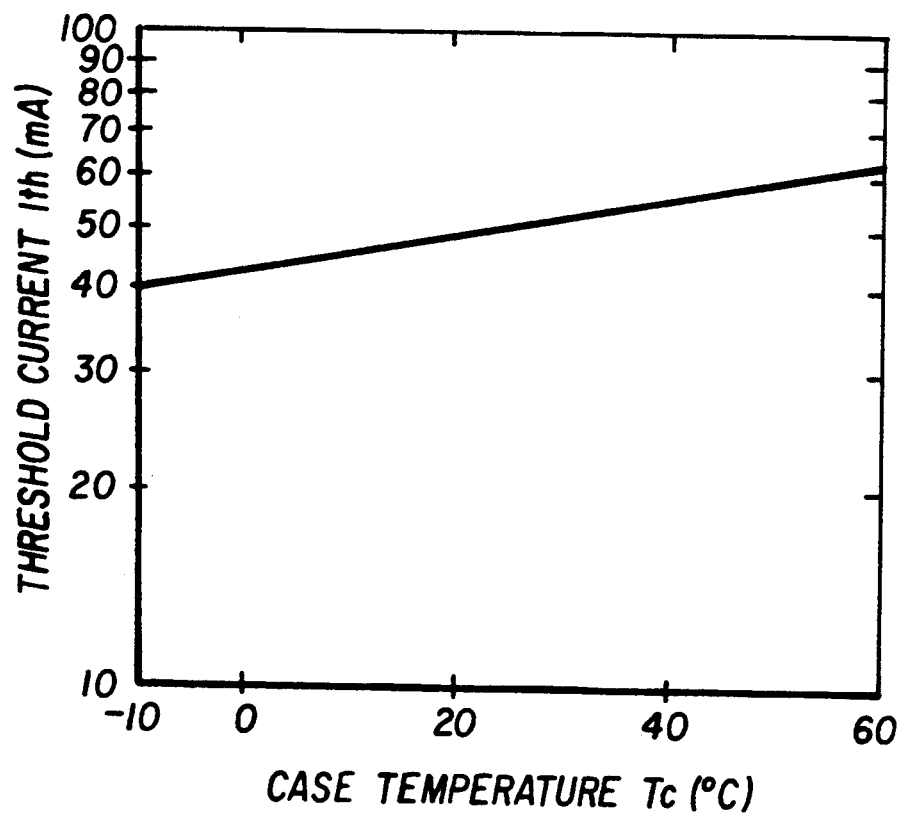
FIG. 4 graphically illustrates the dependency of laser diode threshold current upon temperature showing threshold current in mA vs. case temperature °C.

FIG. 1 illustrates a block diagram of the laser thermal compensation circuit. The laser diode is shown at 10. Laser diodes have characteristic electrical and optical features. The typical forward power characteristic of a series diode is shown in FIG. 3. The curve shows the amount of power (mW) generated by the diode for given forward currents (mA) through the diode. The current level at which the curve's slope increases and becomes constant is called the threshold current of the laser diode. For the diode shown, the range of threshold currents is 30 mA to 50 mA. Beyond this current level, the diode's energy coalesces and the diode is said to lase.

The usable light generated by the laser is emitted through the front facet of the laser diode. A portion of the light generated by the laser diode is emitted through the back facet of the diode. A photo diode is commonly packaged with the laser diode. This photo diode monitors the light emitted from the back facet of the laser diode.

The feedback cycle begins with the back facet of the laser diode 10 a PIN type diode 12. When PIN diode 12 is reverse biased through a resistor 14 to a positive 5 volts at Vcc, the current through diode 12 is linearly proportional to the light power incident upon the diode's active surface.

The voltage produced across the biasing resistor 14 by PIN diode 12 current is used as an input to the feedback amplifier 16. Feedback amplifier 16 has a gain of about two.

Figure 6:
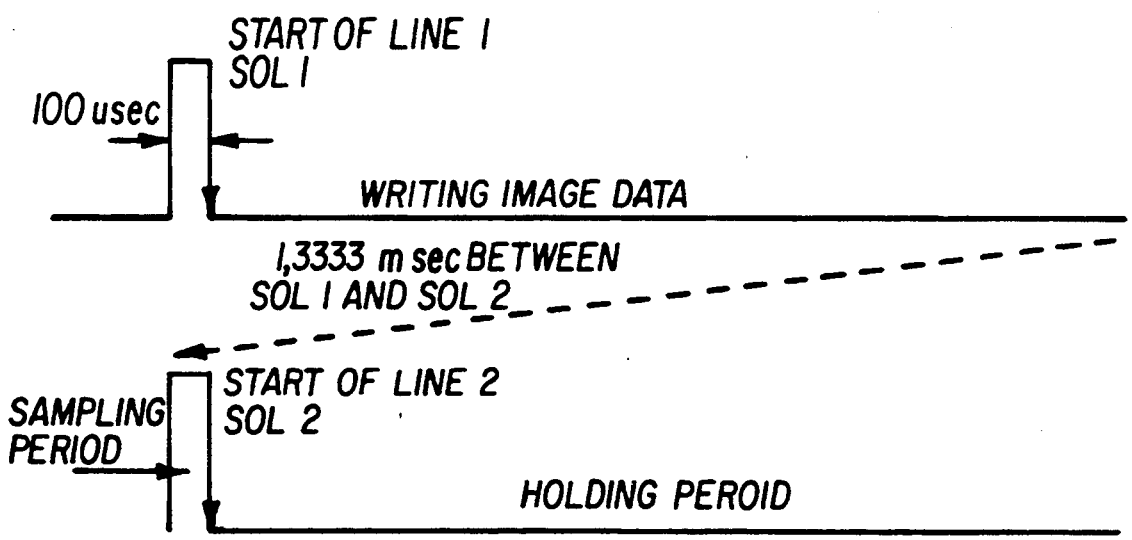
FIG. 6 is a timing diagram for the sample signal.

The output of amplifier 16 is sampled at periodic intervals. The sampling occurs during the sample period at the end of each written line of data as shown in FIG. 6 which is a timing diagram for the sample signal 22. The sampling occurs once every 1.333 milliseconds (750 Hz) outside the active image area when the laser is off the page. It takes about 1.333 milliseconds to write a line of data. The lase then returns to an off page period where the test occurs which takes about 100 μsec before a start of line (SOL) signal is received. Approximately 750 hertz would be the line frequency for a 300 dots per inch, 2.5 inches per second printing apparatus. As mentioned earlier, the sampling signal 22 for the test period is approximately 100 μsec of continuous wave operation. This sampling period would vary with faster or slower printers. If one had 600 dots per inch and a printer operating at 1.25 inches per second, the sampling period would remain the same.

During the sampling period, all inputs to the laser modulator (image data and process control data) are maximized to force the maximum light from the laser diode. The maximum light output condition for the laser diode occurs when the data is OFh (4 bits that are all "1") and the process control data is FFh (8 bits that are all "1"). This occurs during the test period when the sample signal is present. When the sample signal is not present and a line is being written, digital image data appears on the same line. As mentioned before, when the sampling diode is operated in a continuous wave mode which means that there is no pulsing of the diode, it is turned on to a steady state.

Feedback amplifier in an alternative embodiment may receive a second input from a temperature sensor 18. System requirements will determine the need for the temperature sensor in the feedback loop. In cases where the system and image quality requirements are not tightly constrained or there is wide electrostatic process variation, the temperature sensor may be forgone. In these cases, the control of the maximum laser power level can be maintained to approximately ±6% of the nominal maximum laser power level. For high quality gray scale images, a 12% total variation in exposure power over the printer's operating environment is not acceptable. For high quality gray scale images, the temperature sensor is necessary.

The output of feedback amplifier 16 is inputted to a sample and hold amplifier 20 which samples when the sample signal 22 is present. The output of sample and hold amplifier 20 represents the threshold reference current of the laser diode. The summing amplifier 24 combines the threshold reference current with the modulated current derived from the image data and outputs write-ref signal on line 28. Summing amplifier 24 has unity gain and its primary purpose is the combining of the threshold reference signal of the laser with the digital image data (modulated current) when it is at its maximum (all "1" 8 bits) to operate the laser in the continuous wave mode when sample signal 22 is present or with valid digital image data (modulated current) when it is active to operate the laser in the imaging mode when the sample signal 22 is not present. At all times, the output of the summing amplifier will be directly connected to the drive current input to the laser driver 30. The current is pulse width modulated by the digital video data input which is derived from the image data. The range of drive currents is 35 mA to 50 mA.

Figure 2:
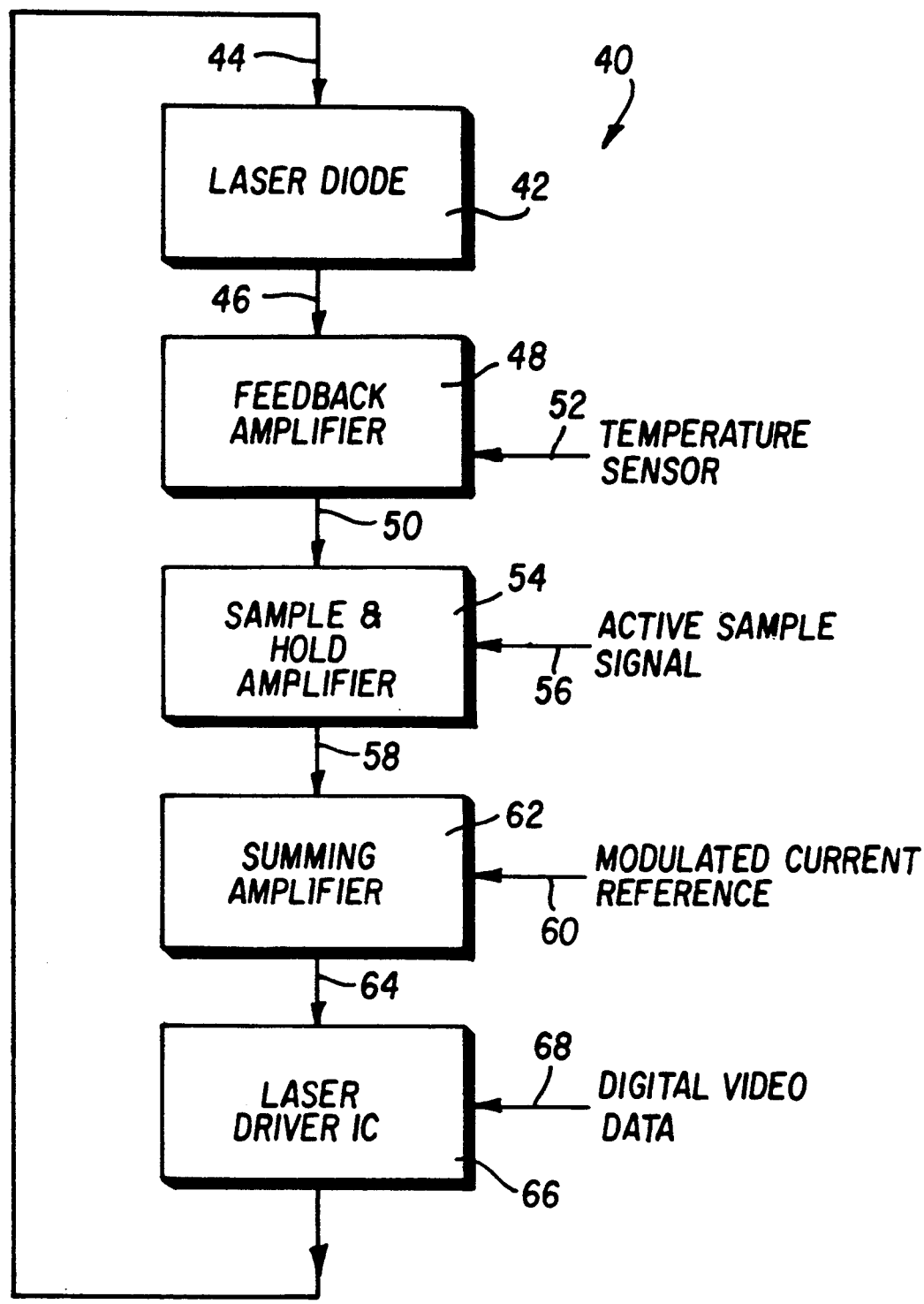
FIG. 2 is a block diagram of the control loop functions that are used to compensate the laser diode power for changes in ambient temperatures.
Figure 5:
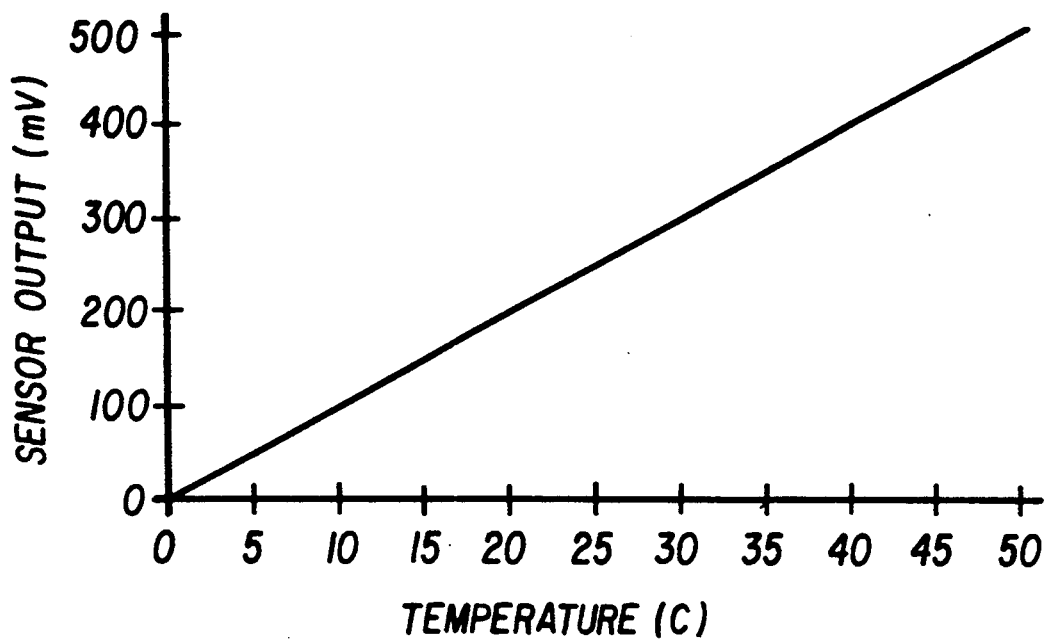
FIG. 5 graphically illustrates the response of the temperature sensor output in mv vs. the temperature in °C.

A block diagram of the control loop functions that are used to compensate the laser diode power for changes in ambient temperature is shown in FIG. 2. Shown generally at 40 is a control loop which is periodically operated to compensate the laser diode power for changing ambient temperatures. The laser diode is represented by box 42 at the top. When control loop 40 is operational, the laser drive on line 44 to laser diode 42 is a known maximum state. The maximum state is defined by the diode in use and the photostatic receiver material (not shown) in the system. The maximum state is maintained for a period of time long enough for the back facet current 46 to stabilize, this period of time is normally on the order of 100 microseconds. Back facet current 46 is an indication of the power level of laser diode 42. The feedback amplifier 48 generates an error signal 50 from back facet current 46 and an input signal from the temperature adjusted reference voltage 52. The signal from temperature adjusted reference voltage 52 is linearly proportional to the ambient temperature of the temperature sensor 18. FIG. 5 illustrates the response of the temperature sensor. Error signal 50 from feedback amplifier 48 is a voltage signal which is proportional to the intensity of the laser and the ambient temperature. The output of feedback amplifier 48 is sampled at periodic intervals; with once a scan line being a convenient interval. A sample and hold amplifier 54 is used to sample output signal 50 of the feedback amplifier 48. When the sampling occurs, the laser is forced to a known and controllable maximum condition as noted earlier. This takes place after the previous line has been written, but before the next line is begun. This sampling interval is signaled by the active sample signal on line 56 which simply indicates that the laser beam is clear of the photostatic receiver material within the printer. During the time the next line is being printed, the output of sample and hold amplifier 54 the threshold current reference 58 will remain constant. Using summing amplifier 62 threshold current reference 58 is added to the gray scale image data dependent modulated current reference 60. The resultant sum is the write-ref 64 and provides the input to the laser driver IC 66. Laser driver IC 66 provides the final stage of amplification to the laser diode 42. Laser driver IC 66 is shown being modulated by digital video data and may be either pulse number or pulse width modulated by the digital video data 68.

The invention has been described in detail with particular reference to a preferred embodiment thereof, but it will be understood that variations and modifications can be effected within the spirit and scope of the invention as described hereinabove and as defined in the appended claims.

We claim:

1. A drive circuit for driving a semiconductor laser having a light output that is modulated in response to digital video data comprising:
    means for generating a sample signal to establish a sampling period;
    means for generating a first signal corresponding to said light output at a maximum level to produce a threshold current reference;
    means for generating a second signal corresponding to the ambient temperature of said laser;
    amplifier means for generating an error signal which is proportional to said first and second signal;
    means for measuring the current level of said laser when modulated to produce a maximum analog modulated current reference signal;
    means for summing said error signal and said modulated current reference signal to produce a drive signal; and
    means for driving said laser in response to said drive signal and modulating the laser in response to the digital video data.

2. A drive circuit as set forth in claim 1 wherein the amplifier means takes the form of a feedback amplifier.

3. A drive circuit as set forth in claim 1 wherein the means for measuring the current level of said laser takes the form of a sample and hold amplifier.

4. A drive circuit as set forth in claim 1 wherein the means for driving the laser takes the form of a laser driver integrated circuit.

5. An optical information recording/reproducing apparatus having a laser diode for radiating a laser beam capable of being modulated by digital video data and writing on a photostatic receiver material controlling the laser power level during a test period, said apparatus comprising:
    means for generating a sample signal to establish a test period;
    means for indicating the power level of the laser diode operating at a maximum level to produce a threshold current level in the form of a first signal;
    means for generating a second signal corresponding to the ambient temperature of said laser diode;
    means for generating a third threshold current reference signal that is proportional to said first and second signals;
    means for sampling said third signal at periodic intervals;
    means for measuring the current level of said laser diode when fully modulated during said test period to produce a modulated current reference signal;
    means for combining the threshold current reference signal with the maximized modulated current to produce a drive signal; and
    means for driving said laser in response to said drive signal and modulating the laser in response to the digital video data.

6. An optical information recording/reproducing apparatus as set forth in claim 5 wherein the means for sampling said third signal takes the form of a sample and hold amplifier.

7. An optical information recording/reproducing apparatus as set forth in claim 5 wherein means for combining takes the form of a summing amplifier.

8. A method of providing thermal compensation for a laser diode that is modulated in response to digital video data and writing on a photostatic receiver material, said laser diode operating at a maximum output during a test period, said method comprising the steps of:
    generating a sample signal to establish a test period;
    generating a first signal corresponding to the light output of said laser diode operating at a maximum level to produce a first signal;
    generating a second signal that corresponds to the ambient temperature of said laser;
    generate and amplify an error signal which is proportional to said first and second signals combined;
    measure the current level of said laser when modulated by said digital video data to obtain an analog modulated current reference signal;

sum said error signal and said modulated current reference signal to produce a drive signal; and operate the laser diode in response to said drive signal and modulate the laser with the digital video data.

9. The method as set forth in claim 8 wherein the first signal corresponds to the light output of said laser diode is generated by a back facet PIN diode of the laser.

10. A method of thermal compensation for a laser diode that is modulated in response to a digital video data and writing on a photostatic receiver material while controlling said laser power during a test period, said method comprising the steps of:

generating a sample signal to establish a test period;

generating a first signal indicating the power level of the laser diode operating at a maximum power level;

generating a second signal corresponding to the ambient temperature of said laser diode;

generating a third threshold current reference signal that corresponds to said first and second signals;

sampling said third signal at periodic intervals;

measuring the current level of said laser diode when modulated by said digital video data to produce a modulated current reference signal;

combine the threshold current reference signal with the modulated current reference signal to produce a drive signal; and drive the laser in response to said drive signal and modulate the laser in response to the digital video data.

11. The method of thermal compensation for a laser diode as set forth in claim 10 wherein sampling of said third signal occurs once a line.

12. A drive circuit for driving a semiconductor laser having a light output that is modulated in response to digital video data comprising:

means for generating a sample signal to establish a sampling period;

means for generating a first signal corresponding to said light output at a maximum level to produce a threshold current reference;

amplifier means for generating an error signal which is proportional to said first and second signal;

means for measuring the current level of said laser when modulated to produce a maximum analog modulated current reference signal;

means for summing said error signal and said modulated current reference signal to produce a drive signal; and means for driving said laser in response to said drive signal and modulating the laser in response to the digital video data.

13. An optical information recording/reproducing apparatus having a laser diode for radiating a laser beam capable of being modulated by digital video data and writing on a photostatic receiver material controlling the laser power level during a test period, said apparatus comprising:

means for generating a sample signal to establish a test period;

means for indicating the power level of the laser diode operating at a maximum level to produce a threshold current level in the form of a first signal;

means for generating a third threshold current reference signal that is proportional to said first signal;

means for sampling said third signal at periodic intervals;

means for measuring the current level of said laser diode when fully modulated during said test period to produce a modulated current reference signal;

means for combining the threshold current reference signal with the maximized modulated current to produce a drive signal; and means for driving said laser in response to said drive signal and modulating the laser in response to the digital video data.

14. A method of providing thermal compensation for a laser diode that is modulated in response to digital video data and writing on a photostatic receiver material, said laser diode operating at a maximum output during a test period, said method comprising the steps of:

generating a sample signal to establish a test period;

generating a first signal corresponding to the light output of said laser diode operating at a maximum level to produce a first signal;

generate and amplify an error signal which is proportional to said first signal;

measure the current level of said laser when modulated by said digital video data to obtain an analog modulated current reference signal;

sum said error signal and said modulated current reference signal to produce a drive signal; and operate the laser diode in response to said drive signal and modulate the laser with the digital video data.

15. A method of thermal compensation for a laser diode that is modulated in response to a digital video data and writing on a photostatic receiver material while controlling said laser power during a test period, said method comprising the steps of:

generating a sample signal to establish a test period;

generating a first signal indicating the power level of the laser diode operating at a maximum power level;

generating a second threshold current reference signal that corresponds to said first signal;

sampling said second signal at periodic intervals;

measuring the current level of said laser diode when modulated by said digital video data to produce a modulated current reference signal;

combine the threshold current reference signal with the modulated current reference signal to produce a drive signal; and drive the laser in response to said drive signal and modulate the laser in response to the digital video data.

* * * * *